US010931268B2

(12) United States Patent
Kim

(10) Patent No.: US 10,931,268 B2
(45) Date of Patent: Feb. 23, 2021

(54) RAMP SIGNAL GENERATION DEVICE AND CMOS IMAGE SENSOR INCLUDING THE SAME

(71) Applicant: SK hynix Inc., Gyeonggi-do (KR)

(72) Inventor: Tae-Gyu Kim, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 91 days.

(21) Appl. No.: 16/127,886

(22) Filed: Sep. 11, 2018

(65) Prior Publication Data

US 2019/0245527 A1 Aug. 8, 2019

(30) Foreign Application Priority Data

Feb. 6, 2018 (KR) .................. 10-2018-0014627

(51) Int. Cl.
| | |
|---|---|
| H04N 5/335 | (2011.01) |
| H03K 4/502 | (2006.01) |
| H04N 5/374 | (2011.01) |
| H03K 4/90 | (2006.01) |
| H03M 1/56 | (2006.01) |
| H04N 5/378 | (2011.01) |
| H04N 5/376 | (2011.01) |

(52) U.S. Cl.
CPC ............ *H03K 4/502* (2013.01); *H03K 4/90* (2013.01); *H03M 1/56* (2013.01); *H04N 5/378* (2013.01); *H04N 5/3742* (2013.01); *H04N 5/376* (2013.01)

(58) Field of Classification Search
CPC .................................. H03K 4/502; H03M 1/56
See application file for complete search history.

(56) References Cited

U.S. PATENT DOCUMENTS

| 10,389,956 | B2* | 8/2019 | Kim | ............ H04N 5/37457 |
| 2013/0062503 | A1* | 3/2013 | Saito | ............ H04N 5/3575 |
| | | | | 250/208.1 |
| 2016/0315602 | A1* | 10/2016 | Sohn | ............ H04N 5/378 |
| 2016/0330387 | A1* | 11/2016 | Hwang | ............ H04N 5/357 |
| 2017/0127001 | A1* | 5/2017 | Song | ............ G05F 3/16 |
| 2017/0155859 | A1* | 6/2017 | Lee | ............ H04N 5/378 |
| 2017/0359521 | A1* | 12/2017 | Kim | ............ H04N 5/243 |

FOREIGN PATENT DOCUMENTS

| CN | 104716934 A | 6/2015 |
| CN | 107026988 A | 8/2017 |
| KR | 1020130110409 | 10/2013 |
| KR | 1020140093246 | 7/2014 |

OTHER PUBLICATIONS

Office Action issued by the China National Intellectual Property Administration dated Nov. 27, 2020.

* cited by examiner

*Primary Examiner* — Gary C Vieaux
(74) *Attorney, Agent, or Firm* — IP & T Group LLP

(57) ABSTRACT

A ramp signal generation device includes a sampling circuit suitable for sampling a ramp current and storing a voltage corresponding to the sampled ramp current; a current maintaining circuit suitable for maintaining the ramp current; a current transferring circuit suitable for transferring a current corresponding to the voltage stored on the sampling circuit; and a current-to-voltage converter suitable for converting and generating a ramp voltage corresponding to the current transferred from the current transferring circuit.

10 Claims, 5 Drawing Sheets

RAMP SIGNAL GENERATION DEVICE AND CMOS IMAGE SENSOR INCLUDING THE SAME

CROSS-REFERENCE TO RELATED APPLICATION

The present application claims priority of Korean Patent Application No. 10-2018-0014627, filed on Feb. 6, 2018, which is incorporated herein by reference in its entirety.

BACKGROUND

1. Field

Exemplary embodiments of the present invention relate to an image sensor. Particularly, embodiments of the present disclosure relate to a ramp signal generation device for acquiring a stable and accurate ramp voltage corresponding to a ramp current and method of generating such a ramp voltage.

2. Description of the Related Art

Recently, complementary metal-oxide-semiconductor (CMOS) image sensors having a high frame rate and a high density have been produced. A single-slope analog-to-digital conversion device (SS-ADC) may be used in the CMOS image sensors.

In the case in which a ramp signal generation device of the CMOS image sensor using the SS-ADC is implemented using a current steering digital-to-analog conversion device, a current amount adjusting technique may be used to adjust a gain of the CMOS image sensor.

The ramp signal generation device generates a ramp signal having a ramp voltage corresponding to a ramp current by copying the ramp current using transistors and transferring a copied ramp current to a ramp resistor.

In a structure of such a ramp signal generation device, a mismatch of respective characteristics among the transistors occurs due to a manufacturing process distribution or the like. Thus, the basic transistor characteristics such as the threshold voltage and the mobility are changed.

That is, although the transistors are designed and manufactured in the same environment, the mismatch occurs due to the manufacturing process distribution or the like. Thus, since the plurality transistors do not have same characteristics, it is difficult to acquire an accurate ramp voltage corresponding to a ramp current, and the value of the ramp voltage is unstable.

SUMMARY

Various embodiments are directed to a ramp signal generation device for acquiring a stable and accurate ramp voltage corresponding to a ramp current by sampling and transferring the ramp current to a ramp resistor, and a CMOS image sensor including the same.

In an embodiment, a ramp signal generation device may include a sampling circuit suitable for sampling a ramp current and storing a voltage corresponding to the sampled ramp current; a current maintaining circuit suitable for maintaining the ramp current; a current transferring circuit suitable for transferring a current corresponding to the voltage stored on the sampling circuit; and a current-to-voltage converter suitable for converting and generating a ramp voltage corresponding to the current transferred from the current transferring circuit.

In an embodiment, a CMOS image sensor may include a pixel array including pixels, suitable for generating a pixel signal corresponding to incident light received at each pixel; a row decoder coupled to the pixel array and suitable for selecting and controlling the pixels of the pixel array row by row; a ramp signal generation device suitable for sampling a ramp current, storing a voltage corresponding to a sampled ramp current, transferring the ramp current corresponding to a stored voltage to a ramp resistor, and generating a ramp voltage; a comparison circuit suitable for comparing the ramp voltage applied from the ramp signal generation device with the pixel signal received from the pixel array; a counter suitable for performing a counting operation based on the comparison signal; a memory suitable for storing information outputted from the counter; a column read-out circuit suitable for outputting the information stored in the memory; and a controller suitable for controlling the row decoder, the ramp signal generation device, the comparison circuit, the counter, the memory and the column read-out circuit.

In an embodiment, a method of generating a ramp voltage may include sampling a ramp current and storing a voltage corresponding to the sampled ramp current; maintaining the ramp current; transferring a current corresponding to the stored voltage; and converting and generating a ramp voltage corresponding to the transferred current.

DETAILED DESCRIPTION

Figure 1:
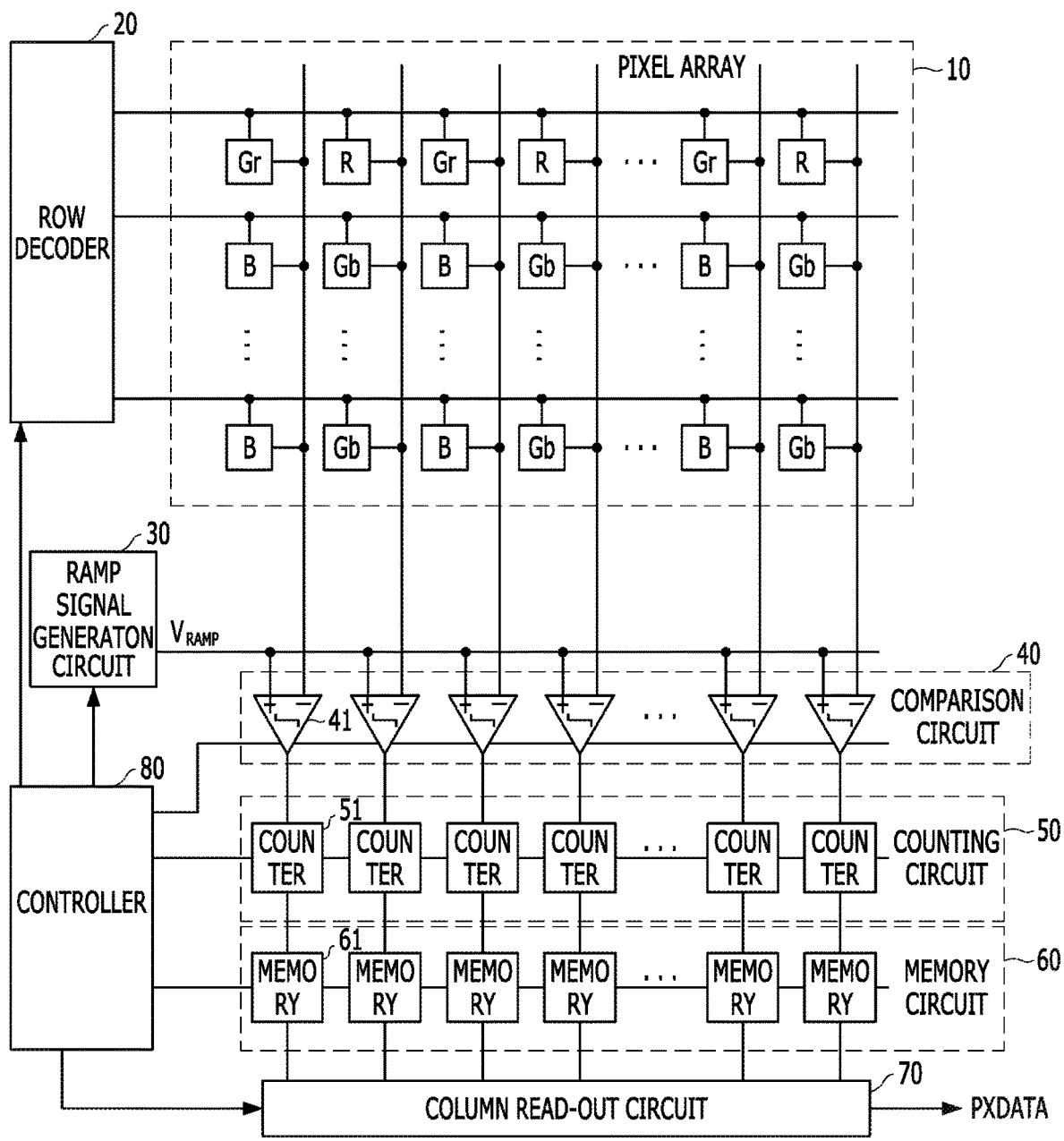
FIG. 1 is a diagram illustrating an example of a CMOS image sensor.

Various embodiments will be described below in more detail with reference to the accompanying drawings. The present disclosure may, however, be embodied in different forms and should not be construed as limited to the embodiments set forth herein. Rather, these embodiments are provided so that this disclosure is thorough and complete and fully conveys the scope of the present disclosure to those skilled in the art. Throughout the disclosure, like reference numerals refer to like parts throughout the various figures and embodiments of the present disclosure. Also, throughout the specification, reference to "an embodiment," "another embodiment," or the like is not necessarily to the same embodiment, and different references to any such phrase are not necessarily to the same embodiment(s)

It will be understood that when an element is referred to as being "coupled" to another element, it may be directly coupled to the element or electrically coupled thereto with other elements interposed therebetween. Furthermore, when an element is referred to as "comprising" or "including" a component, it does not preclude one or more other components but may further include such other component(s), unless the context clearly indicates otherwise. The terminology used herein is for the purpose of describing particular embodiments and is not intended to be limiting.

FIG. 1 is a diagram illustrating an example of a CMOS image sensor. The CMOS image sensor shown in FIG. 1 represents a CMOS image sensor having a column parallel structure using a single-slope analog-to-digital conversion device.

Referring to FIG. 1, the CMOS image sensor may include a pixel array 10 including imaging pixels arranged in rows and columns, a row decoder 20, a ramp signal generation circuit 30, a comparison circuit 40, a counting circuit 50, a memory circuit 60, a column read-out circuit 70 and a control circuit 80.

The pixel array 10 may output pixel signals in response to incident light at individual imaging pixels. The row decoder 20 may select and control pixels of the pixel array 10 row by row. The ramp signal generation circuit 30 may generate a ramp signal $V_{RAMP}$ in response to a control signal of the control circuit 80. The comparison circuit 40 may compare the ramp signal $V_{RAMP}$ of the ramp signal generation circuit 30 with each pixel signal outputted from the pixel array 10.

The counting circuit 50 may count the number of clock pulses from the control circuit 80 according to output signals of the comparison circuit 40. The memory circuit 60 may store information (e.g., the number of clock pulses) provided by the counting circuit 50 according to instructions provided by the control circuit 80. The column read-out circuit 70 may output sequentially the information stored in the memory circuit 60 as a pixel data PXDATA according to instructions provided by the control circuit 80. The control circuit 80 may control operations of the row decoder 20, the ramp signal generation circuit 30, the comparison circuit 40, the counting circuit 50, the memory circuit 60 and the column read-out circuit 70.

As such, the CMOS image sensor may include the comparison circuit 40 that utilizes a correlated double sampling (CDS) technique to remove an offset value of the pixel.

The comparison circuit 40 may include a plurality of comparators 41, the counting circuit 50 may include a plurality of counters 51, and the memory circuit 60 may include a plurality of memories 61. In an example configuration, each column of the pixel array 10 may include one comparator 41, one counter 51 and one memory 61.

The operations of an exemplary comparator 41, counter 51 and memory 61 will be described below.

The comparator 41 has two input terminals that receive a pixel signal outputted from a column of the pixel array 10 and a ramp signal $V_{RAMP}$ outputted from the ramp signal generation circuit 30, respectively. The comparator 41 may compare the ramp signal $V_{RAMP}$ with the pixel signal and outputs a comparison signal in response to a control signal provided by the control circuit 80.

Since a voltage level of the ramp signal $V_{RAMP}$ increases or decreases as time passes, the ramp signal $V_{RAMP}$ may cross the pixel signal at a certain point in time. After this crossing point, the value of the comparison signal outputted from the comparator 41 may be inverted.

The counter 51 may be used to count pulses during a period of time, for example, when a level of the pixel signal is above that of the ramp signal. The counter 51 may be initialized by a reset control signal of the control circuit 80.

The memory 61 may store information relating to the count (e.g., number of pulses) provided by the counter 51 and output the information to the column read-out circuit 70 according to control signals of the control circuit 80. Here, the CMOS image sensor may perform a counting operation on a reset signal (or a reset voltage) and then perform a counting operation on an image signal (or a signal voltage).

Figure 2:
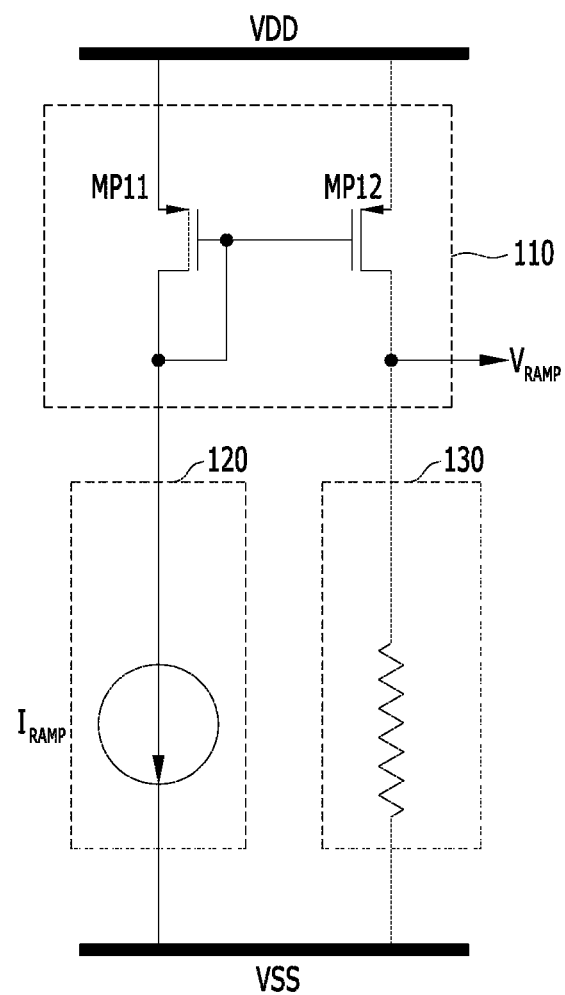
FIG. 2 is a circuit diagram illustrating an example of a ramp signal generation device shown in FIG. 1.

FIG. 2 is a circuit diagram illustrating an example of a ramp signal generation device 30 shown in FIG. 1.

Referring to FIG. 2, the ramp signal generation device 30 may include a current copy circuit 110, a current maintaining circuit 120 and a current-to-voltage converter 130.

The current copy circuit 110 may copy and transfer a ramp current $I_{RAMP}$. The current maintaining circuit 120 may maintain the ramp current $I_{RAMP}$, which flows on the current copy circuit 110. The current-to-voltage converter 130 may generates a ramp voltage $V_{RAMP}$ corresponding to the ramp current $I_{RAMP}$ transferred from the current copy circuit 110.

More specifically, the current copy circuit 110 may include a first PMOS transistor MP11 and a second PMOS transistor MP12. A source terminal of the first PMOS transistor MP11 is coupled to a power supply voltage VDD terminal. The PMOS transistor MP11 has a diode-connection structure that a gate terminal of the first PMOS transistor MP11 is coupled to a drain terminal of the first PMOS transistor MP11. A source terminal of the second PMOS transistor MP12 is coupled to the power supply voltage VDD terminal. A gate terminal of the second PMOS transistor MP12 is coupled to the gate terminal of the first PMOS transistor MP11, and a drain terminal of the second PMOS transistor MP12 is coupled to an output node.

The current maintaining circuit 120 may be implemented using a current source. A first terminal of the current source is coupled to the drain terminal of the first PMOS transistor MP11 and a second terminal of the current source is coupled to a ground voltage VSS terminal.

The current-to-voltage converter 130 may be implemented using a ramp resistor. A first terminal of the ramp resistor is coupled to the output node and a second terminal of the ramp resistor is coupled to the ground voltage VSS terminal.

As described above, the ramp signal generation device shown in FIG. 2 uses the first PMOS transistor MP11 and the second PMOS transistor MP12 in order to copy and transfer the ramp current $I_{RAMP}$ to the ramp resistor.

That is, in the ramp signal generation device shown in FIG. 2, when the ramp current $I_{RAMP}$ flows on the first PMOS transistor MP11 having the diode-connection structure, the ramp current $I_{RAMP}$ is copied to the second PMOS transistor MP12 by a voltage of the first PMOS transistor MP11, which is applied to the gate terminal of the second PMOS transistor MP12. Thus, the ramp signal having the ramp voltage $V_{RAMP}$ is generated by the copied ramp current, which flows on the ramp resistor.

Herein, if the first PMOS transistor MP11 and the second PMOS transistor MP12 have the same characteristics, a ramp voltage corresponding the ramp current may be acquired. However, due to a manufacturing process distribution of transistors or the like, a mismatch between the first PMOS transistor MP11 and the second PMOS transistor MP12 may occur, and the basic transistor characteristics such as the threshold voltage and the mobility of the first PMOS transistor MP11 and the second PMOS transistor MP12 may not be the same. Thus, the ramp signal generation device shown in FIG. 2 may not be used in a device that needs a high accuracy.

That is, although the first PMOS transistor MP11 and the second PMOS transistor MP12 are designed and manufactured in the same environment, the mismatch between the transistors may occur due to the manufacturing process distribution or the like. Thus, since the first PMOS transistor MP11 and the second PMOS transistor MP12 do not have same characteristics, it is difficult to acquire an accurate ramp voltage corresponding to a ramp current $I_{RAMP}$, and the level of the ramp voltage $V_{RAMP}$ may be unstable.

In embodiments of the present disclosure, an accurate and stable ramp voltage corresponding to a ramp current may be generated by sampling and transferring the ramp current to the ramp resistor. This configuration and operation will be described in details with reference to FIGS. 3A to 4.

Figure 3A:
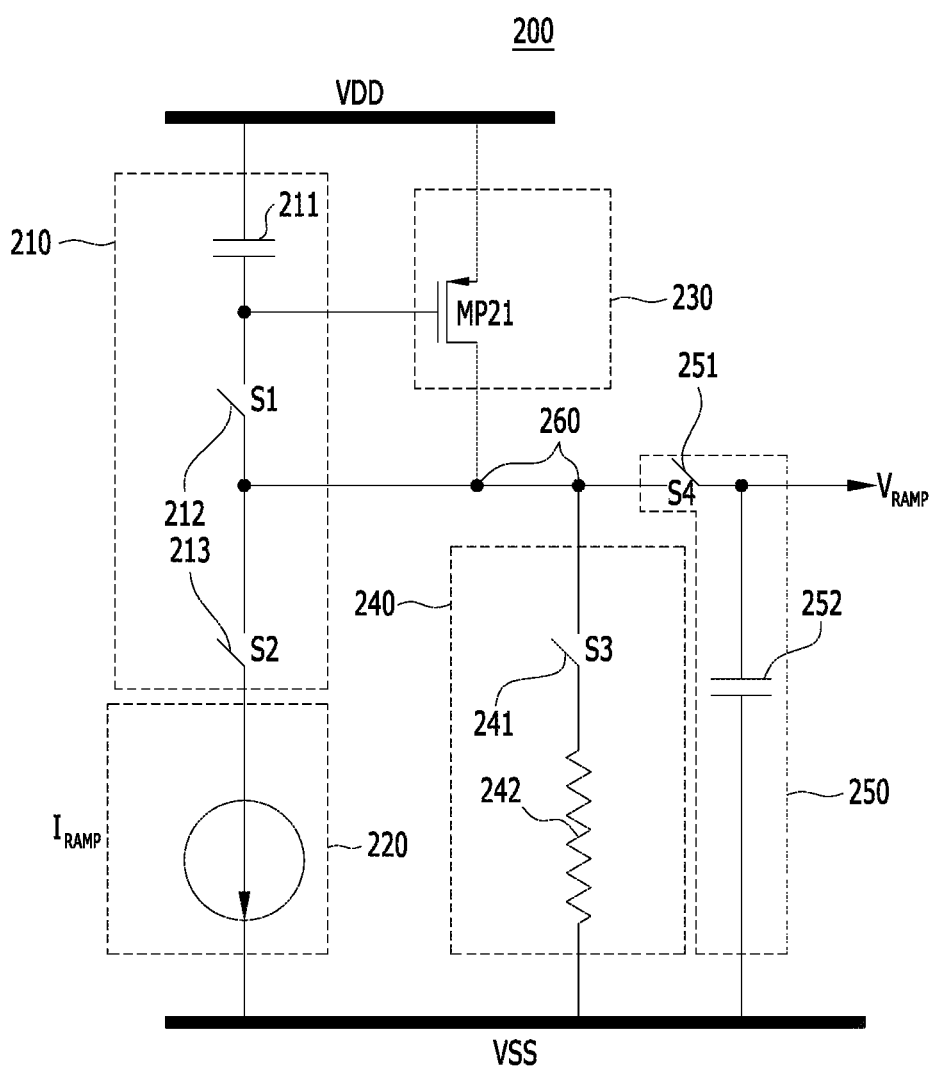
FIG. 3A is a circuit diagram illustrating a ramp signal generation device in accordance with an embodiment of the present disclosure.
Figure 3B:
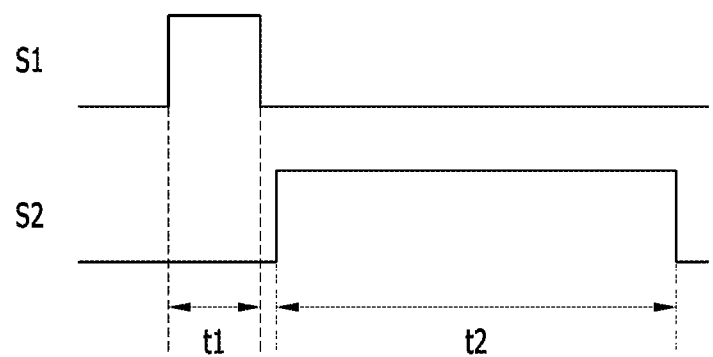
FIG. 3B is a timing diagram illustrating an operation of a ramp signal generation device in accordance with an embodiment of the present disclosure.

FIG. 3A is a circuit diagram illustrating an example of a ramp signal generation device 200 in accordance with an embodiment of the present disclosure. FIG. 3B is a timing diagram illustrating an operation of a ramp signal generation device in accordance with an embodiment of the present disclosure, for example, the ramp signal generation device 200 shown in FIG. 3A.

Referring to FIG. 3A, the ramp signal generation device 200 may include a sampling circuit 210, a current maintaining circuit 220, a current transferring circuit 230 and a current-voltage converter 240.

The sampling circuit 210 may sample the ramp current IRAMP and store a voltage of the sampled ramp current. The current maintaining circuit 220 may maintain constantly the ramp current IRAMP. The current transferring circuit 230 may transfer a current corresponding to the voltage stored on the sampling circuit 210. The current-to-voltage converter 240 may generate a ramp voltage VRAMP corresponding to the current transferred from the current transferring circuit 230. The ramp signal generation device 200 may further include an output circuit 250 for stabilizing and outputting the ramp voltage, which is converted by the current-to-voltage converter 240.

The sampling circuit 210 may include a capacitor 211 and a switching circuit including switches 212 and 213.

A first terminal of the capacitor 211 may be coupled to a power supply voltage VDD terminal. The capacitor 211 may sample the ramp current $I_{RAMP}$ and store the voltage of the sampled ramp current. The switching circuit may couple between the current maintaining circuit 220 and a second terminal of the capacitor 211 and may switch on or off the ramp current $I_{RAMP}$.

The switching circuit may include a first switch (S1) 212 and a second switch (S2) 213. A first terminal of the first switch 212 may be coupled to the second terminal of the capacitor 211, and the first switch 212 may switch on or off the ramp current $I_{RAMP}$. The second switch 213 may be coupled between a second terminal of the first switch 212 and the current maintaining circuit 220, and switches on or off the ramp current $I_{RAMP}$.

The current maintaining circuit 220 may be implemented using a current source. A first terminal of the current source may be coupled to the second switch 213 and a second terminal of the current source may be coupled to a ground voltage VSS terminal.

The current transferring circuit 230 may include a PMOS transistor MP21. A source terminal of the PMOS transistor MP21 may be coupled to the power supply VDD terminal. A gate terminal of the PMOS transistor MP21 may be coupled to the second terminal of the capacitor 211 of the sampling circuit 210. A drain terminal of the PMOS transistor MP21 may be coupled to an output node 260.

The current-to-voltage converter 240 may include a third switch (S3) 241 and a ramp resistor 242. A first terminal of the third switch 241 may be coupled to the output node 260. The third switch 241 may switch on or off the current transferred from the current transferring circuit 230. The ramp resistor 242 may couple between a second terminal of the third switch 241 and the ground voltage VSS terminal.

The ramp resistor 242 may generate the ramp voltage $V_{RAMP}$ corresponding to the current transferred through the third switch 241.

The output circuit 250 may include a fourth switch (S4) 251 and a second capacitor 252. The fourth switch 251 may be coupled between the current-to-voltage converter 240 and the output node 260. The second capacitor 252 may couple between the output node 260 and the ground voltage VSS terminal.

As described above, a current transfer technique of the ramp signal generation device 200 shown in FIG. 3A is different from a current transfer technique of the ramp signal generation device 30 shown in FIG. 2.

That is, in an embodiment of the present disclosure, after sampling and storing a ramp current $I_{RAMP}$ using a capacitor 211 and switches S11 and S12 in the sampling circuit 210, a ramp voltage is generated by transferring the current corresponding to the stored voltage. Thus, a problem of an unstable ramp signal caused by mismatch of the transistors may be solved.

Referring to FIGS. 3A and 3B, when the first switch (S1) 212 and the second switch (S2) 213 are switched on and the third switch (S3) 241 and the fourth switch (S4) 251 are switched off, e.g., during a first period t1, a gate terminal of the PMOS transistor MP21 is coupled to a source terminal of the PMOS transistor MP21. Thus, the ramp current $I_{RAMP}$ flows on the PMOS transistor MP21, and a gate-source voltage of the PMOS transistor MP21 is stored on the capacitor 211.

Subsequently, when the first switch (S1) 212 and the second switch (S2) 213 are switched off, the gate-source voltage of the PMOS transistor MP21 stored on the capacitor 211 is maintained. Herein, if the third switch (S3) 241 is switched on, e.g., during a second period t2, a current corresponding to the value of the stored gate-source voltage of the PMOS transistor MP21 flows through the ramp resistor 242 and a ramp voltage $V_{RAMP}$ is generated.

Next, if the fourth switch (S4) 251 is switched on, a stable ramp voltage $V_{RAMP}$ corresponding to the ramp resistor 242 may be outputted even when transistors of the ramp signal generation device are affected by a manufacturing process distribution.

Figure 4:
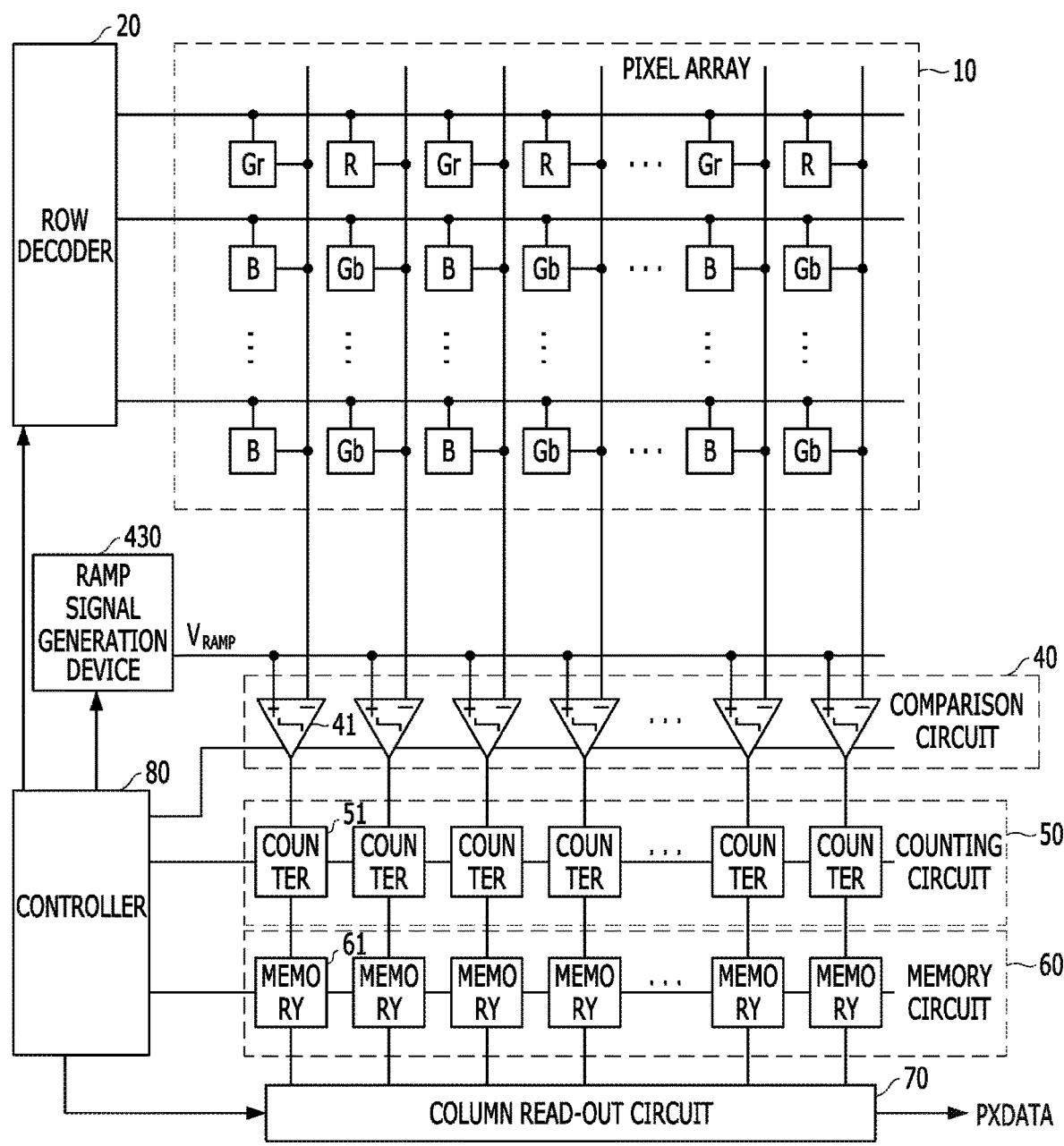
FIG. 4 is a diagram illustrating an example of a CMOS image sensor in accordance with embodiments of the present disclosure.

FIG. 4 is a diagram illustrating an example of a CMOS image sensor in accordance with embodiments of the present disclosure.

Referring to FIG. 4, the CMOS image sensor may include a pixel array 10, a row decoder 20, a ramp signal generation device 430, a comparison circuit 40, a counting circuit 50, a memory circuit 60, a column read-out circuit 70 and a controller 80.

The pixel array 10 may output pixel signals corresponding to incident light. The row decoder 20 may select and control pixels of the pixel array 10 row by row. The ramp signal generation device 430 may generate a ramp signal $V_{RAMP}$ (including a coarse ramping signal and a fine ramping signal) in response to a control signal of the controller 80. The comparison circuit 40 may compare the ramp signal $V_{RAMP}$ of the ramp signal generation circuit 30 with each pixel signal outputted from the pixel array 10.

The counting circuit 50 may count the number of clock pulses of the controller 80 according to output signals of the comparison circuit 40. The memory circuit 60 may store information (e.g., the number of clock pulses) provided by the counting circuit 50 according to instructions provided by the controller 80. The column read-out circuit 70 may output sequentially the information stored in the memory circuit 60 as a pixel data PXDATA according to instructions provided by the controller 80. The controller 80 may control operations of the row decoder 20, the ramp signal generation circuit 30, the comparison circuit 40, the counting circuit 50, the memory circuit 60 and the column read-out circuit 70.

Here, the ramp signal generation device 430 may be implemented by the ramp signal generation device 200 shown in FIG. 3A.

As described above, a ramp signal generation device in accordance with embodiments of the present disclosure acquires a stable and accurate ramp voltage corresponding to a ramp current by sampling and transferring the ramp current to a ramp resistor.

Although various embodiments and specific examples have been described, various changes and modifications may be made based on what is described and illustrated. Thus, the present invention encompasses all such changes and modifications that fall within the scope of the claims.

What is claimed is:

1. A ramp signal generation device, comprising:
 a sampling circuit configured to sample a ramp current of the ramp signal generation device and store a voltage corresponding to the sampled ramp current;
 a current maintaining circuit configured to maintain the ramp current;
 a current transferring circuit configured to transfer a current corresponding to the voltage stored on the sampling circuit;
 a current-to-voltage converter configured to convert and generate a ramp voltage corresponding to the current transferred from the current transferring circuit; and
 an output circuit configured to stabilize and output the ramp voltage;
 wherein the output circuit includes:
 a switch coupled between the current-to-voltage converter and an output node; and
 a capacitor coupled between the output node and a ground voltage terminal.

2. The ramp signal generation device of claim 1, wherein the sampling circuit includes:
 a capacitor having a first terminal coupled to a power supply voltage terminal, and configured to sample the ramp current and store the voltage corresponding to the sampled ramp current; and
 a switching circuit coupled between a second terminal of the capacitor and the current maintaining circuit, and configured to switch the ramp current on or off.

3. The ramp signal generation device of claim 2, wherein the switching circuit includes:
 a first switch having a first terminal coupled to the second terminal of the capacitor, and configured to switch on or off the ramp current; and
 a second switch coupled between a second terminal of the first switch and the current maintaining circuit, and configured to switch on or off the ramp current.

4. The ramp signal generation device of claim 1, wherein the current transferring circuit includes a transistor having a source terminal coupled to a power supply voltage terminal, a gate terminal coupled to the sampling circuit, and a drain terminal coupled to an output node.

5. The ramp signal generation device of claim 1, wherein the current-to-voltage converter includes:
 a third switch having a first terminal coupled to an output node, and configured to switch on or off the current transferred from the current transferring circuit; and
 a ramp resistor coupled between a second terminal of the third switch and a ground voltage terminal, and configured to generate the ramp voltage corresponding to the current transferred through the third switch.

6. A complementary metal-oxide-semiconductor (CMOS) image sensor, comprising:
 a pixel array including pixels, configured to generate a pixel signal corresponding to incident light received at each pixel;
 a row decoder coupled to the pixel array and configured to select and control the pixels of the pixel array row by row;
 a ramp signal generation device configured to sample a ramp current, store a voltage corresponding to the sampled ramp current, transfer a current corresponding to the stored voltage to a ramp resistor, and generate a ramp voltage corresponding to the transferred current;
 a comparison circuit configured to compare the ramp voltage applied from the ramp signal generation device with the pixel signal received from the pixel array;
 a counter configured to perform a counting operation based on the comparison signal;
 a memory configured to store information outputted from the counter;
 a column read-out circuit configured to output the information stored in the memory; and
 a controller configured to control the row decoder, the ramp signal generation device, the comparison circuit, the counter, the memory and the column read-out circuit,
 wherein the ramp signal generation device includes:
 a sampling circuit configured to sample the ramp current and store the voltage corresponding to the sampled ramp current;
 a current maintaining circuit configured to maintain the ramp current;
 a current transferring circuit configured to transfer a current corresponding to the voltage;
 a current-to-voltage converter configured to convert and generate the ramp voltage corresponding to a current transferred from the current transferring circuit; and
 an output circuit configured to stabilize and output the ramp voltage, which is converted by the current-voltage converter,
 wherein the output circuit includes:
 a switch coupled between the current-to-voltage converter and an output node; and
 a capacitor coupled between the output node and a ground voltage terminal.

7. The CMOS image sensor of claim 6, wherein the sampling circuit includes:
 a capacitor having a first terminal coupled to a power supply voltage terminal and configured to sample the ramp current and storing the voltage corresponding to a sampled ramp current; and
 a switching circuit coupled between a second terminal of the capacitor and the current maintaining circuit, and configured to switch the ramp current on or off.

8. The CMOS image sensor of claim 6, wherein the switching circuit includes:
 a first switch having a first terminal coupled to the second terminal of the capacitor, and configured to switch on or off the ramp current; and
 a second switch coupled between a second terminal of the first switch and the current maintaining circuit, and configured to switch on or off the ramp current.

9. The CMOS image sensor of claim 6, wherein the current transferring circuit includes a transistor having a source terminal coupled to a power supply voltage terminal, a gate terminal coupled to the sampling circuit, and a drain terminal coupled to an output node.

10. The CMOS image sensor of claim 6, wherein the current-to-voltage converter includes:
   a third switch having a first terminal coupled to an output node, and configured to switch on or off the current transferred from the current transferring circuit; and
   a ramp resistor coupled between a second terminal of the third switch and a ground voltage terminal, and configured to generate the ramp voltage corresponding to the current transferred through the third switch.

* * * * *